United States Patent
Chang et al.

(10) Patent No.: US 11,042,201 B2
(45) Date of Patent: Jun. 22, 2021

(54) HEAD-MOUNTED DISPLAY DEVICE

(71) Applicant: HTC Corporation, Taoyuan (TW)

(72) Inventors: Li-Hsun Chang, Taoyuan (TW); Kuan-Ying Ou, Taoyuan (TW)

(73) Assignee: HTC Corporation, Taoyuan (TW)

( * ) Notice: Subject to any disclaimer, the term of this patent is extended or adjusted under 35 U.S.C. 154(b) by 5 days.

(21) Appl. No.: 16/505,727

(22) Filed: Jul. 9, 2019

(65) Prior Publication Data

US 2020/0110449 A1    Apr. 9, 2020

Related U.S. Application Data

(60) Provisional application No. 62/742,446, filed on Oct. 8, 2018.

(51) Int. Cl.
*H05K 7/00* (2006.01)
*G06F 1/20* (2006.01)
*H05K 7/20* (2006.01)
*G06F 1/16* (2006.01)

(52) U.S. Cl.
CPC .............. *G06F 1/203* (2013.01); *G06F 1/163* (2013.01); *H05K 7/20145* (2013.01); *H05K 7/20154* (2013.01); *H05K 7/20172* (2013.01); *G06F 2200/201* (2013.01)

(58) Field of Classification Search
None
See application file for complete search history.

(56) References Cited

U.S. PATENT DOCUMENTS

| | | | |
|---|---|---|---|
| 6,409,338 B1* | 6/2002 | Jewell | G02C 11/08 2/171.3 |
| 8,695,121 B2* | 4/2014 | Nolan | A42B 3/24 2/171.3 |
| 2017/0184863 A1 | 6/2017 | Balachandreswaran et al. | |
| 2018/0098465 A1* | 4/2018 | Reynolds | G02B 27/028 |
| 2018/0307282 A1 | 10/2018 | Allin et al. | |
| 2018/0348812 A1* | 12/2018 | Miller | H04N 5/2251 |

FOREIGN PATENT DOCUMENTS

| CN | 205679858 | 11/2016 |
|---|---|---|
| CN | 206196228 | 5/2017 |
| CN | 206975323 | 2/2018 |
| CN | 107995957 | 5/2018 |

OTHER PUBLICATIONS

"Office Action of Taiwan Counterpart Application," dated Mar. 16, 2020, p. 1-p. 11.

* cited by examiner

*Primary Examiner* — Anthony Q Edwards
*Assistant Examiner* — Rashen E Morrison
(74) *Attorney, Agent, or Firm* — JCIPRNET

(57) ABSTRACT

The disclosure provides a head-mounted display device, including a body and a fan. The body is used for wearing on a user's face. The body has an airflow channel, a first tuyere, and a second tuyere. The airflow channel is connected to the outside via the first tuyere and the airflow channel is connected to a space between the body and the user's face via the second tuyere. The fan is configured in the airflow channel and is used for driving the airflow in the airflow channel.

11 Claims, 4 Drawing Sheets

HEAD-MOUNTED DISPLAY DEVICE

CROSS-REFERENCE TO RELATED APPLICATION

This application claims the priority benefit of U.S. provisional application Ser. No. 62/742,446, filed on Oct. 8, 2018. The entirety of the above-mentioned patent application is hereby incorporated by reference herein and made a part of this specification.

BACKGROUND

Technical Field

The disclosure relates to a head-mounted display device, and more particularly to a head-mounted display device capable of improving wearing comfort.

Description of Related Art

With the advancement of the technology industry, there is a lot of types of head-mounted display devices. Taking the head-mounted display device such as an eye-mask type as an example, after a user wears such a display device, in addition to seeing a stereoscopic image, the image also changes following the rotation of the user's head, thereby providing the user with a more immersive experience.

However, after the user wears the head-mounted display device for a period of time, the hot air and moisture on the user's face together with the waste heat generated during the operation of the head-mounted display device will cause the temperature and humidity of the air in the space between the user's face and the head-mounted display device to gradually rise, thereby resulting in the user feeling uncomfortable. Therefore, how to provide the user with a more comfortable using experience is an extremely important topic in the art.

SUMMARY

The disclosure provides a head-mounted display device capable of improving wearing comfort.

The head-mounted display device of the disclosure includes a body and a fan. The body is used for wearing on a user's face. The body has an airflow channel, a first tuyere, and a second tuyere. The airflow channel is connected to the outside via the first tuyere and the airflow channel is connected to the space between the body and the user's face via the second tuyere. The fan is configured in the airflow channel and is used for driving the airflow in the airflow channel.

Based on the above, in the head-mounted display device of the disclosure, the body has the airflow channel connected with the first tuyere, the second tuyere, and the outside. The fan disposed in the airflow channel can drive the airflow in the airflow channel, so as to reduce the temperature and humidity of the air in the space between the body and the user's face, thereby improving the comfort of the user wearing the head-mounted display device.

To make the aforementioned and other features of the disclosure more comprehensible, several embodiments accompanied with drawings are described in detail as follows.

DETAILED DESCRIPTION OF DISCLOSED EMBODIMENTS

Figure 1:
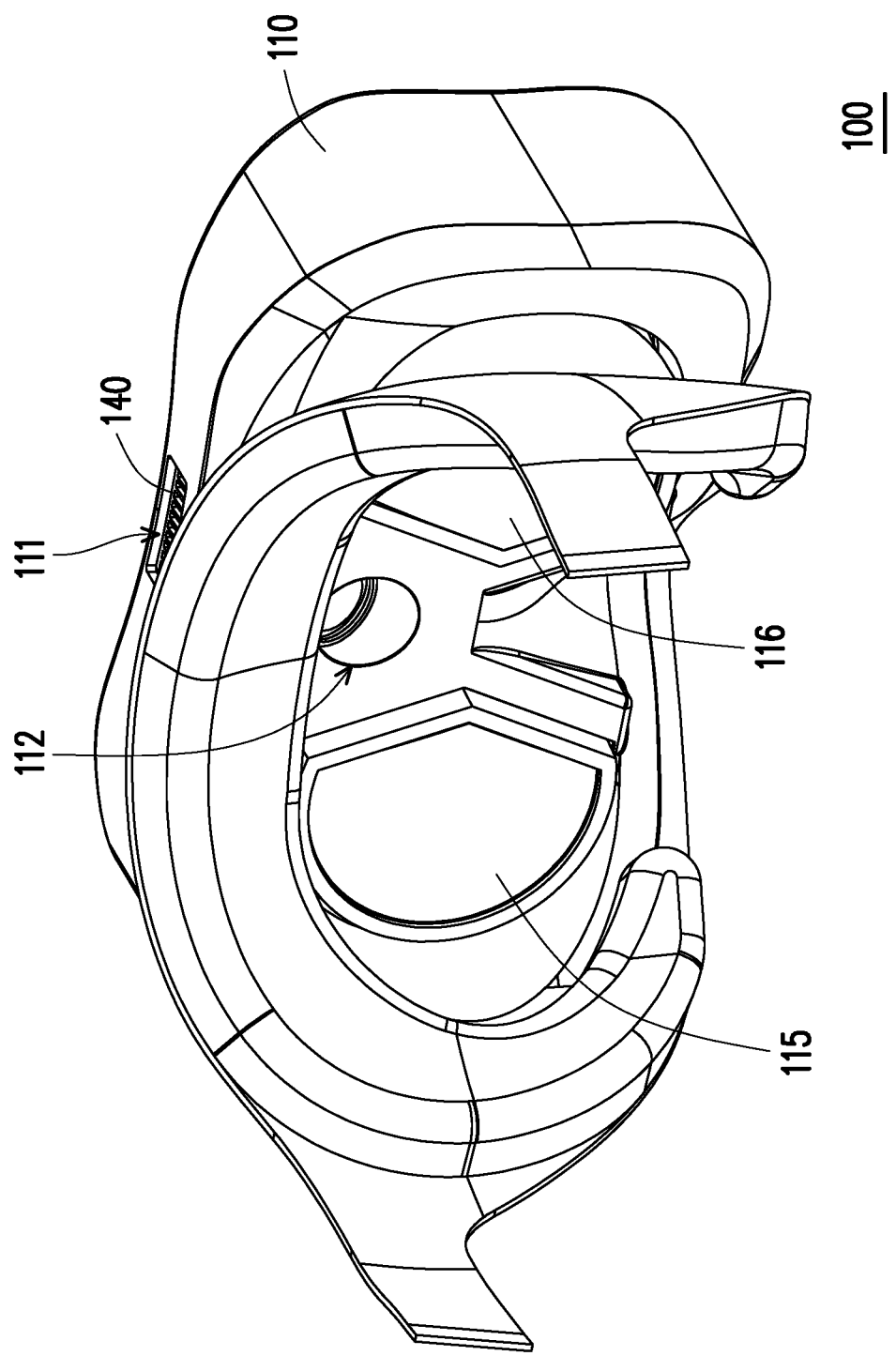
FIG. 1 is a perspective schematic view of a head-mounted display device in accordance with an embodiment of the invention.
Figure 2:
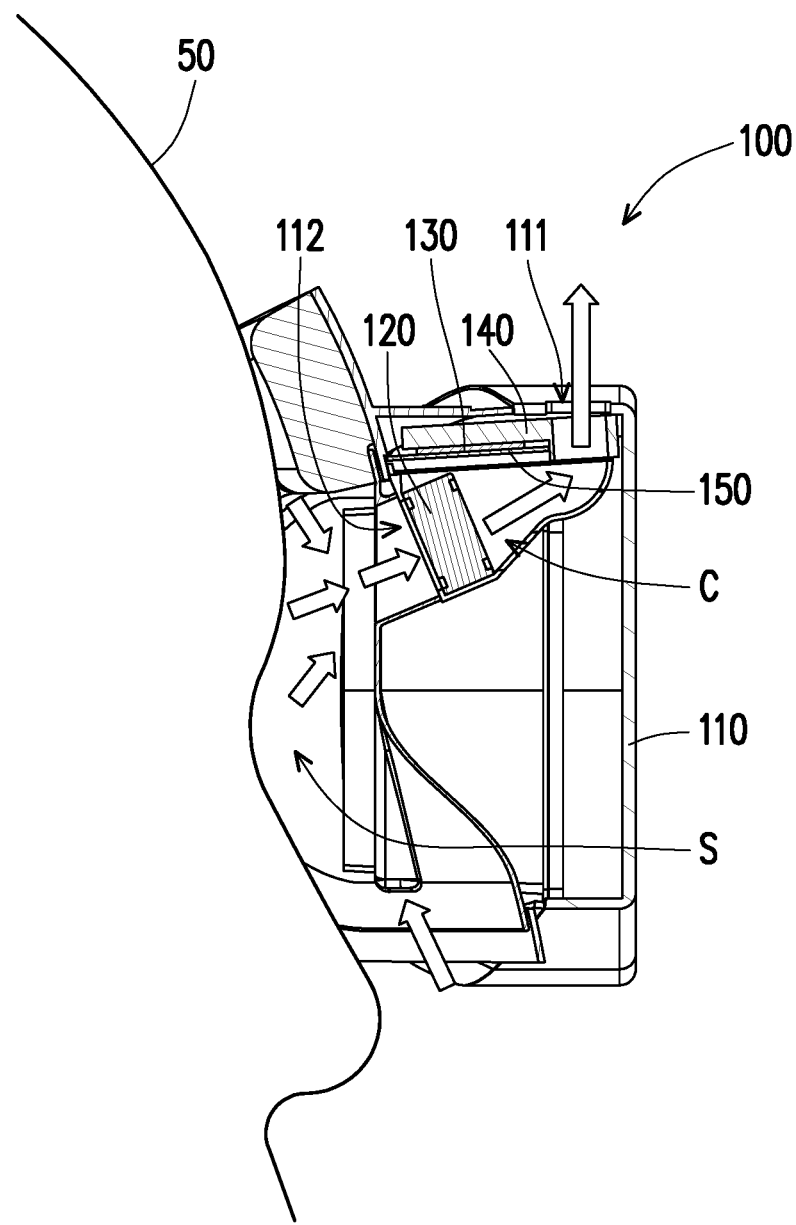
FIG. 2 is a cross-sectional schematic view of a portion of the head-mounted display device of FIG. 1 worn by a user.

FIG. 1 is a perspective schematic view of a head-mounted display device in accordance with an embodiment of the invention. FIG. 2 is a cross-sectional schematic view of a portion of the head-mounted display device of FIG. 1 worn by a user. Referring to FIG. 1 and FIG. 2, a head-mounted display device 100 of the embodiment includes a body 110 and a fan 120 located in the body 110. The body 110 includes a display part and a face-fitting frame, wherein the face-fitting frame is used for wearing and contacting the face of a user 50. When the user wears the head-mounted display device 100, a space S connected to the outside is formed between the body 110 and the face of the user 50. In the embodiment, the body 110 has an airflow channel C, a first tuyere 111, and a second tuyere 112 connected to one another. The airflow channel C is connected to the outside via the first tuyere 111 and is connected to the space S between the body 110 and the face of the user 50 via the second tuyere 112. The fan 120 is configured in the airflow channel C and is used for driving the airflow in the airflow channel C.

As described above, the fan 120 configured in the airflow channel C is used to drive the airflow in the airflow channel C, thereby driving the air in the space S to enter the airflow channel C via the second tuyere 112, and to finally leave the body 110 through the first tuyere 111. As the air in the airflow channel C flows, the outside air also flows into the space S, which helps to reduce the temperature and humidity of the air in the space S, thereby improving wearing comfort of the user 50.

In the embodiment, the body 110 of the head-mounted display device 100 has a heating element 130, a heat sink 140, and a circuit board 150. The heating element 130 and the heat sink 140 are configured on the circuit board 150, and the heat sink 140 is in contact with the heating element 130. It should be noted that the term "contact" mentioned here indicates that heat may be transferred between the heat sink 140 and the heating element 130, and the method of contact includes direct physical contact or indirect contact through a heat conductive adhesive, a heat dissipating plate, a heat pipe, or other types of heat conductive members. The heating element 130 is, for example, a central processing unit (CPU) or other chips. The heat sink 140 is, for example, a heat dissipating fin, and a portion of the heat sink 140 is located in the airflow channel C. In detail, the first tuyere 111 is formed on the upper surface of the body 110. The heat sink 140 is near to the first tuyere 111 and is used for cooling the heating element 130.

As shown by the arrows in FIG. 2, the fan 120 drives the air to flow into the airflow channel C via the second tuyere 112, and to finally pass through the heat sink 140 and leave the body 110 from the first tuyere 111. At the same time, the outside air with a lower temperature and humidity flows into the space S to improve wearing comfort of the user 50. In addition, when the air in the airflow channel C passes through the heat sink 140, the air can further cool the heat sink 140. Therefore, the heat generated by the heating element 130 can move away from the body 110 more quickly. In more detail, as compared to the outside air, the humidity of the air in the space S is higher. Therefore, when the air with a higher humidity flows through the heat sink 140, the heat dissipation efficiency of the heat sink 140 may be improved.

In the embodiment, as shown in FIG. 1, the body 110 has a left lens 115 and a right lens 116. The left lens 115 and the right lens 116 respectively correspond to the left eye and the right eye of the user 50, and the eyes of the user 50 view the image provided by the display part in the body 110 through the left lens 115 and the right lens 116. In the embodiment, the second tuyere 112 is located between the left lens 115 and the right lens 116, and is located above a nose pad, but the disclosure is not limited thereto. When the body 110 is worn on the face of the user 50, the second tuyere 112 substantially faces the glabella of the user 50. More preferably, the second tuyere 112 faces the glabella of the user 50.

Based on design requirement, the position of the second tuyere 112 may also be adjusted as appropriate. For example, in other embodiments, the position of the second tuyere 112 may also be located above the left lens 115 or above the right lens 116. When the body 110 is worn on the face of the user 50, the second tuyere 112 substantially faces the forehead of the user 50. In another embodiment, the position of the second tuyere 112 may also be located above the middle of the left lens 115 and the right lens 116. When the body 110 is worn on the face of the user 50, the second tuyere 112 substantially faces above the glabella of the user 50. In other words, the second tuyere 112 substantially corresponds to the upper portion of the space S. Since the position of the second tuyere 112 is offset from the eyes of the user 50, when the user 50 wears the head-mounted display device 100, the user 50 does not see the second tuyere 112. In more detail, when the user 50 wears the head-mounted display device 100, the air with a higher temperature and humidity easily accumulates in the upper portion of the space S. By having the second tuyere 112 to substantially correspond to the upper portion of the space S, the air can be more easily carried by the fan 120 into the airflow channel C and discharged out of the body 110.

In the embodiment, the fan 120 may be rotated in the reverse direction. For example, when the user 50 uses the head-mounted display device 100, the fan 120 can temporarily blow in the direction toward the user 50 according to the displayed content to provide a more realistic experience.

Figure 3:
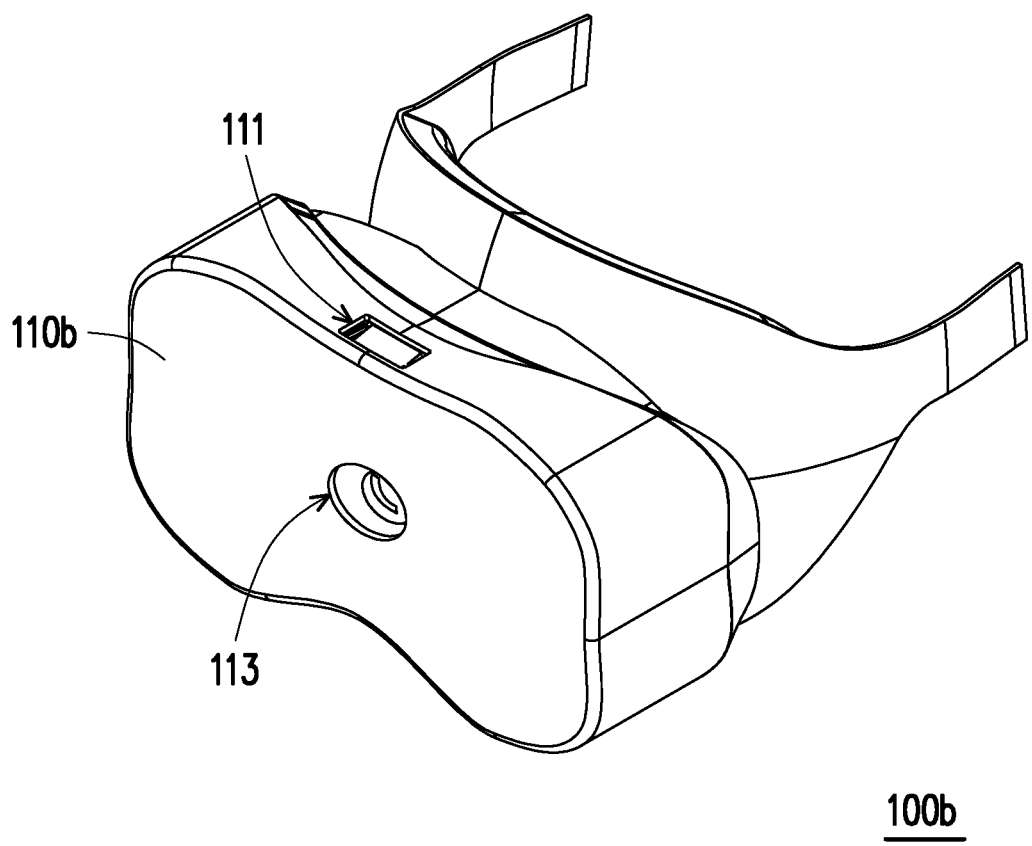
FIG. 3 is a perspective schematic view of a head-mounted display device in accordance with another embodiment of the invention.
Figure 4:
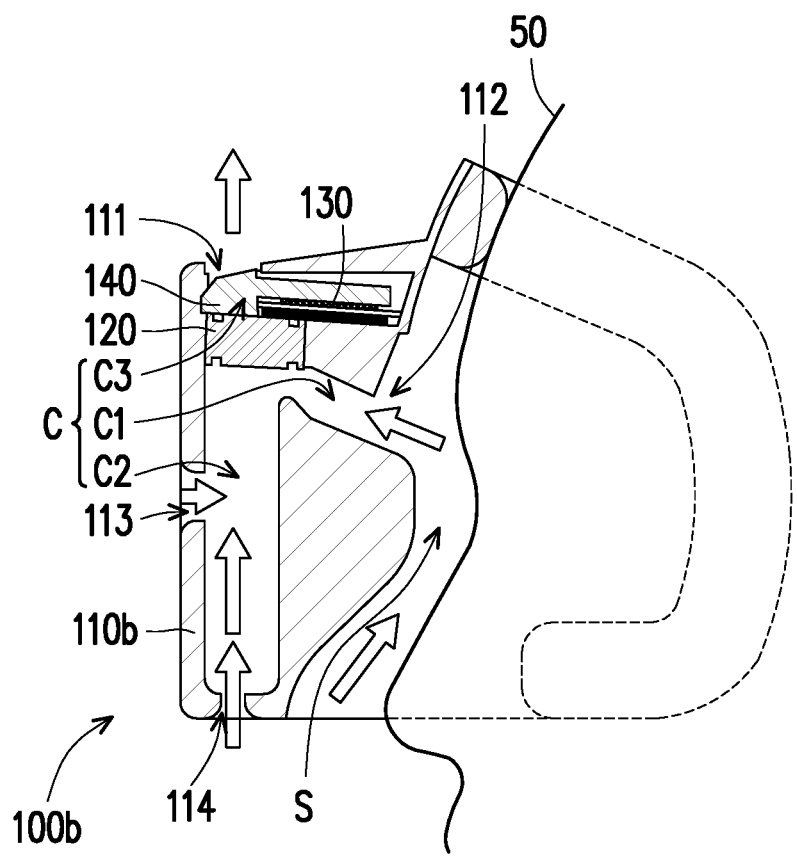
FIG. 4 is a schematic view of the head-mounted display device of FIG. 3 worn by a user.

FIG. 3 is a perspective schematic view of a head-mounted display device in accordance with another embodiment of the invention. FIG. 4 is a schematic view of the head-mounted display device of FIG. 3 worn by a user. The difference between a head-mounted display device 100b shown in FIG. 3 and the head-mounted display device 100 shown in FIG. 1 and FIG. 2 is that a body 110b of the head-mounted display device 100b further has a third tuyere 113 and a fourth tuyere 114. The third tuyere 113 is located on a side of the body 110b away from the face of the user 50, that is, the front side of the body 110b. In detail, the third tuyere 113 is formed on the front surface of the body 110b. The fourth tuyere 114 is opposite to the first tuyere 111 and is located on the lower side of the body 110b. Further, the first tuyere 111 and the fourth tuyere 114 are respectively located on the upper surface and the lower surface of the body 110b. The fourth tuyere 114 is connected to the first tuyere 111, the second tuyere 112, the third tuyere 113, and the space S between the body 110b and the face of the user 50.

In the embodiment, the fan 120 is configured in the airflow channel C and is near to the first tuyere 111. The heat sink 140 is near to the first tuyere 111, and a portion of the heat sink 140 is located in the airflow channel C and is in contact with the heating element 130. As mentioned above, the term "contact" mentioned here indicates that heat may be transferred between the heat sink 140 and the heating element 130, and the method of contact includes direct physical contact or indirect contact through a heat conductive adhesive, a heat dissipating plate, a heat pipe, or other types of heat conductive members. When the user 50 wears the head-mounted display device 100b, the fan 120 drives the outside air to flow into the airflow channel C via the third tuyere 113 and the fourth tuyere 114, and to leave the body 110b from the first tuyere 111. At the same time, after the fan 120 drives the outside air to flow into the space S between the body 110b and the face of the user 50, the air flows into the airflow channel C via the second tuyere 112 and leaves from the first tuyere 111. By disposing the fourth tuyere 114 in the body 110b, a larger amount of the outside air flows into the airflow channel C, thereby providing a better heat dissipation effect.

In more detail, as shown in FIG. 4, in the embodiment, the airflow channel C includes a first sub-channel C1, a second sub-channel C2, and a third sub-channel C3 connected to one another. An end of the first sub-channel C1 is connected to the second tuyere 112. The second sub-channel C2 is connected to the third tuyere 113 and the fourth tuyere 114. An end of the third sub-channel C3 is connected to the first tuyere 111, and the other end of the third sub-channel C3 is connected to the first sub-channel C1 and the second sub-channel C2, that is, the other end of the third sub-channel C3 is substantially at the junction of the first sub-channel C1 and the second sub-channel C2. In detail, the fan 120 is configured at the third sub-channel C3. The outside air flows into the first sub-channel C1 via the second tuyere 112 or flows into the second sub-channel C2 from the fourth tuyere 114 and the third tuyere 113, and finally flows through the third sub-channel C3 and leaves from the first tuyere 111. Based on heat dissipation requirement, the fan 120 has to provide a higher flow rate to effectively cool the heat sink 140, so as to remove the heat generated by the heating element 130. However, when the flow rate in the space S is too large, the user 50 may easily feel dryness in the eyes.

In the embodiment, the flow rate at the first tuyere 111 is equal to the flow rate in the first sub-channel C1 together with the flow rate in the second sub-channel C2. The cross-sectional area of the first sub-channel C1 and the second sub-channel C2 are appropriately designed, for example, allowing the cross-sectional area of the first sub-channel C1 to be smaller than the cross-sectional area of the second sub-channel C2, in other words, the flow rate in the first sub-channel C1 is smaller than the flow rate at the first tuyere 111. Therefore, the flow rate in the first sub-channel C1 is smaller, thereby reducing the possibility of the user 50 feeling dryness in the eyes. At the same time, the fan 120 of the embodiment may also remove the air with a higher temperature and humidity in the space S, and introduce the outside air to improve wearing comfort of the user 50. In addition, the fan 120 can also provide a sufficient flow rate to cool the heat sink 140.

In the embodiment, the third tuyere 113 is disposed on the front surface of the body 110b and the fourth tuyere 114 is disposed on the bottom portion of the body 110b. However, the position and number of the tuyeres may also vary based on actual requirements, and the disclosure is not limited thereto.

In the embodiment, the cross-sectional area ratio and/or the channel length of the first sub-channel C1, the second sub-channel C2, and the third sub-channel C3 may be adjusted and the fan 120 may be selected as appropriate. Therefore, apart from meeting the heat dissipation requirement of the body, the possibility of the user 50 feeling dryness in the eyes may be reduced, and the temperature and humidity in the space S may also be reduced, so as to improve wearing comfort.

Based on the above, in the head-mounted display device of the disclosure, the body has the airflow channel and the fan is configured in the airflow channel. The airflow channel is connected to the outside via the first tuyere and is connected to the space between the body and the user's face via the second tuyere. The fan near the first tuyere can cool the heat sink, and the heat sink in turn cools the heating element. When the user wears the head-mounted display device of the disclosure, the fan drives the air to flow between the space between the body and the user's face and the airflow channel, thereby improving the heat dissipation effect. At the same time, when the air in the space between the body and the user's face flows out, waste heat and moisture are also taken out, so as to reduce the temperature and humidity in the space, thereby improving wearing comfort.

Although the disclosure has been disclosed in the above embodiments, the embodiments are not intended to limit the disclosure. It will be apparent to persons skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A head-mounted display device, comprising:
   a body for wearing on a face of a user, wherein the body is formed with an airflow channel inside an inner space of the body, a first tuyere, and a second tuyere, the airflow channel is connected to an outside of the head-mounted display device via the first tuyere, and the airflow channel is connected to a space between the body and the face of the user via the second tuyere; and
   a fan, mechanically coupled with the airflow channel, for driving an airflow in the airflow channel,
   wherein the body has a heating element and a heat sink therein, a portion of the heat sink is located in the airflow channel, and the heat sink is in contact with the heating element.

2. The head-mounted display device according to claim 1, wherein the body has a left lens and a right lens, the second tuyere is located between the left lens and the right lens, above the left lens, or above the right lens.

3. The head-mounted display device according to claim 2, wherein the second tuyere corresponds to a glabella or a forehead of the user.

4. The head-mounted display device according to claim 1, wherein the heat sink is near to the first tuyere, after the fan drives outside air to flow into the space between the body and the face of the user, air flows into the airflow channel via the second tuyere and leaves from the first tuyere.

5. The head-mounted display device according to claim 4, wherein the body further has a third tuyere located on a side of the body away from the face of the user, and the airflow channel is connected to the third tuyere.

6. The head-mounted display device according to claim 5, wherein the fan drives outside air to flow into the airflow channel via the third tuyere and to leave from the first tuyere.

7. The head-mounted display device according to claim 6, wherein the body further has a fourth tuyere located on a lower side of the body, the airflow channel is connected to the fourth tuyere.

8. The head-mounted display device according to claim 7, wherein the fan drives outside air to flow into the airflow channel via the fourth tuyere and to leave from the first tuyere.

9. The head-mounted display device according to claim 1, wherein the fan drives outside air to flow from the first tuyere into the body and blows in a direction toward the user.

10. The head-mounted display device according to claim 5, wherein the airflow channel comprises a first sub-channel, a second sub-channel, and a third sub-channel, an end of the first sub-channel is connected to the second tuyere, the second sub-channel is connected to the third tuyere, an end of the third sub-channel is connected to the first tuyere, another end of the third sub-channel is connected to the first sub-chancel and the second sub-channel, and an flow rate at the first tuyere is equal to a sum of an flow rate in the first sub-channel and an flow rate in the second sub-channel.

11. The head-mounted display device according to claim 10, wherein a cross-sectional area of the first sub-channel is smaller than a cross-sectional area of the second sub-channel.

* * * * *